United States Patent
Chang et al.

(10) Patent No.: US 9,368,588 B2
(45) Date of Patent: Jun. 14, 2016

(54) INTEGRATED CIRCUITS WITH NON-VOLATILE MEMORY AND METHODS FOR MANUFACTURE

(71) Applicant: Spansion LLC, Sunnyvale, CA (US)

(72) Inventors: Kuo Tung Chang, Saratoga, CA (US); Chun Chen, San Jose, CA (US); Shenqing Fang, Fremont, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/484,417

(22) Filed: Sep. 12, 2014

(65) Prior Publication Data

US 2015/0031197 A1 Jan. 29, 2015

Related U.S. Application Data

(62) Division of application No. 13/715,565, filed on Dec. 14, 2012, now Pat. No. 8,836,006.

(51) Int. Cl.
*H01L 29/66* (2006.01)
*H01L 29/423* (2006.01)
*H01L 27/115* (2006.01)
*H01L 29/40* (2006.01)

(52) U.S. Cl.
CPC .... *H01L 29/42344* (2013.01); *H01L 27/11568* (2013.01); *H01L 27/11573* (2013.01); *H01L 29/401* (2013.01); *H01L 29/66833* (2013.01)

(58) Field of Classification Search
CPC ................... H01L 27/11526; H01L 27/11529; H01L 27/11531; H01L 27/11568; H01L 29/42344; H01L 29/401
USPC .......... 438/201, 211, 257, 593; 257/E21.179, 257/E21.422, E21.68
See application file for complete search history.

(56) References Cited

U.S. PATENT DOCUMENTS

| | | | |
|---|---|---|---|
| 5,824,584 A | 10/1998 | Chen et al. |
| 5,969,383 A | 10/1999 | Chang et al. |
| 6,972,997 B2 | 12/2005 | Ishimaru et al. |
| 7,057,230 B2 | 6/2006 | Tanaka et al. |
| 7,115,943 B2 | 10/2006 | Mine et al. |
| 7,371,631 B2 | 5/2008 | Sakai et al. |
| 7,414,283 B2 | 8/2008 | Tanaka et al. |

(Continued)

FOREIGN PATENT DOCUMENTS

JP 2011-14920 A 1/2011
KR 10-2008-0102957 A 11/2008

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

(Continued)

*Primary Examiner* — Thanhha Pham

(57) ABSTRACT

Semiconductor devices and the manufacture of such semiconductor devices are described. According to various aspects of the disclosure, a semiconductor device can include a memory region, a first logic region, and a second logic region. A select gate can be formed in the memory region of the device and a first logic gate formed in the logic region. A charge trapping dielectric can then be disposed and removed from a second logic region. A gate conductor layer can then be disposed on the device and etched to define a memory gate on the sidewall of the select gate and a second logic gate in the second logic region.

14 Claims, 22 Drawing Sheets

500

(56) References Cited

U.S. PATENT DOCUMENTS

| | | |
|---|---|---|
| 7,504,689 B2 | 3/2009 | Hisamoto et al. |
| 7,557,005 B2 | 7/2009 | Ishii et al. |
| 7,663,176 B2 | 2/2010 | Sakai et al. |
| 7,667,259 B2 | 2/2010 | Yasui et al. |
| 7,700,992 B2 | 4/2010 | Tanaka et al. |
| 7,723,779 B2 | 5/2010 | Hisamoto et al. |
| 7,863,135 B2 | 1/2011 | Sakai et al. |
| 7,863,670 B2 | 1/2011 | Ishii et al. |
| 7,915,666 B2 | 3/2011 | Yasui et al. |
| 8,017,986 B2 | 9/2011 | Tanaka et al. |
| 8,125,012 B2 | 2/2012 | Mine et al. |
| 8,836,006 B2 | 9/2014 | Chang et al. |
| 2007/0207581 A1 | 9/2007 | Yasui et al. |
| 2009/0273013 A1 | 11/2009 | Winstead et al. |
| 2010/0029052 A1 | 2/2010 | Kang et al. |
| 2010/0059810 A1 | 3/2010 | Homma et al. |
| 2011/0211396 A1 | 9/2011 | Takeuchi |
| 2014/0120713 A1* | 5/2014 | Shroff et al. .......... 438/593 |

OTHER PUBLICATIONS

Matsubara, K., et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., Hitachi, "A 512kB MONOS type Flash Memory Module Embedded in a Microcontroller," 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008.

Yanagi, I., et al., "Quantum confinement effect of efficient hole injection in MONOS-type nonvolatile memory—the role of ultrathin i-Si/$P^+$ poly-Si stacked gate structure fabricated by laser spike annealing," 146-147, Symposium on VLSI Technology, Digest of Technical Papers, Central Research Laboratory, Hitachi Ltd., 2007.

International Search Report and Written Opinion of the International Searching Authority for International Application No. PCT/US2013/073327, mailed Mar. 17, 2014.

English language abstract for Japanese patent application publication No. 2011-14920-A, published Jan. 20, 2011.

USPTO Non-Final Rejection for U.S. Appl. No. 13/715,565 dated Aug. 9, 2013; 6 pages.

USPTO Notice of Allowance for U.S. Appl. No. 13/715,565 dated May 15, 2014; 7 pages.

* cited by examiner

INTEGRATED CIRCUITS WITH NON-VOLATILE MEMORY AND METHODS FOR MANUFACTURE

CROSS-REFERENCE TO RELATED APPLICATIONS

This application is a divisional of and claims priority to U.S. patent application Ser. No. 13/715,565 filed on Dec. 14, 2012, the entirety of which is hereby incorporated by reference.

BACKGROUND

1. Technical Field

This disclosure relates generally to improved embedded semiconductor products and methods and apparatus for making such semiconductor products.

2. Related Art

A non-volatile memory cell in a non-volatile core array is programmed using, for example, hot carrier injection to place charge into a storage layer. High drain and gate voltages are used to facilitate the programming process, and the memory cell conducts relatively high current during programming, which can be undesirable in low voltage or low power applications.

A split-gate non-volatile memory cell is a type of non-volatile memory cell, in which a select gate is placed adjacent a memory gate. During programming of a split-gate non-volatile memory cell, the select gate is biased at a relatively low voltage, and only the memory gate is biased at the high voltage to provide the vertical electric field necessary for hot-carrier injection. That makes hot-carrier injection more efficient during programming operation compared to conventional non-split gate memory cell. A split-gate non-volatile memory cell may be programmed using techniques other than hot-carrier injection, and depending on the technique, any advantage over the conventional non-volatile memory cell during programming operation may vary.

Fast read time is another advantage of a split-gate non-volatile memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

It is common to monolithically incorporate multiple types of field-effect devices on the same substrate as the memory cells. Those devices perform, for example, decoding, charge-pumping, and other functions related to memory operations. The substrate may also include devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate non-volatile memory cell, with the processing of one or more types of non-memory transistors on the same substrate is challenging as each requires different fabrication parameters. For example, for high speed performance requirement, the gate length of the non-memory transistors needs to be shorter such that it requires thinner gate stack for easier processing. However, for non-memory transistors to handle higher operating voltages, the junction of the transistors needs to be more graded. This usually is accomplished by higher implantation energy during the junction formation. Thicker gate stack is needed to prevent implant penetration. Therefore, it is desirable to have a method to have different gate stack thickness for different non-memory transistors and integrate with non-volatile memory cells on the same semiconductor device. Accordingly, there is a need for device and methods for integrating a memory cell and other devices with different electrical requirements on the same substrate to facilitate improved cost, performance, reliability, or manufacturability.

BRIEF SUMMARY OF THE INVENTION

According to an embodiment, a method of manufacturing a semiconductor device that includes a first region, a second region, and a third region is provided. According to the method, a first gate dielectric is formed on substrate. A select gate dielectric is formed in the first region after removing the first gate dielectric from the first region. A select gate can be formed in the first region and a first logic gate is formed in the second region. The select gate dielectric which is not covered by the select gate in the first region was removed. A charge trapping dielectric may then be disposed. The charge trapping dielectric and the first gate dielectric can then be removed from the third region and a gate conductor layer disposed. The gate conductor layer may be removed (e.g., etched) to define a memory gate on a sidewall of the select gate and a second logic gate in the third region. The removal of gate conductor layer may further include deposition and etch of hard mask stack prior to removal of gate conductor layer.

According to embodiments, a semiconducting device is provided. The semiconducting device includes a select gate formed in a first region, a first logic gate formed in a second region, and a second logic gate formed in a third region. The thickness of the first logic gate may be the same or different from the second logic gate. In case the first logic gate thickness is different from that of the second logic gate, each of the first logic gate and second logic gate are formed separately by a single layer of gate material. Additionally, the device includes a memory gate formed on a sidewall of the select gate, wherein the memory gate has a width that is substantially similar to the thickness of the second logic gate.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
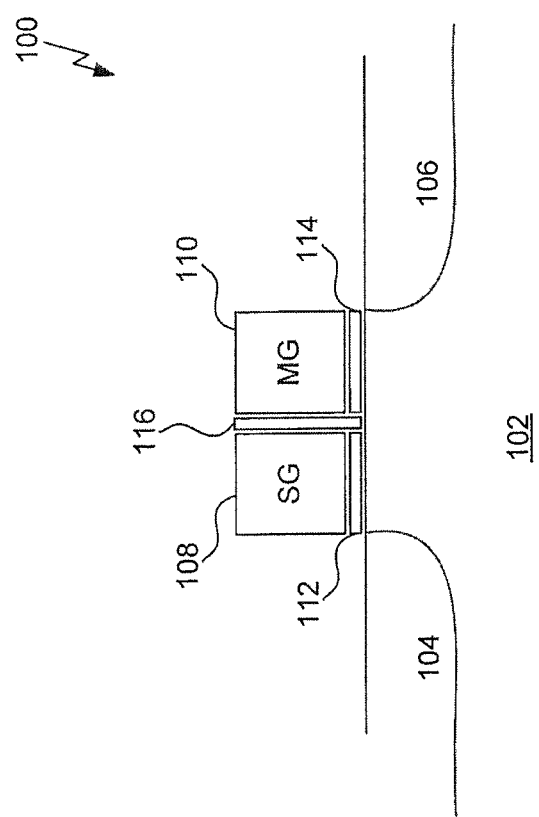
FIG. 1 depicts a cross-section of a split-gate non-volatile memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may comprise a gate conductor such as doped polycrystalline silicon ("poly") layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. After the gates have been defined, regions 104 and 106 are created by implanting dopants using, for example, an ion implantation technique. Regions 104 and 106 form the source or drain of the split-gate non-volatile memory cell depending on what potentials are applied to each. In split-gate non-volatile memory cell, for convenience, region 104 is commonly referred to as the drain, while region 106 is commonly referred to as the source, independent of the relative biases. It is to be understood that this description is meant to provide a general overview of common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 is either grounded or at a certain bias such as 0.5V, and substrate 102 is grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
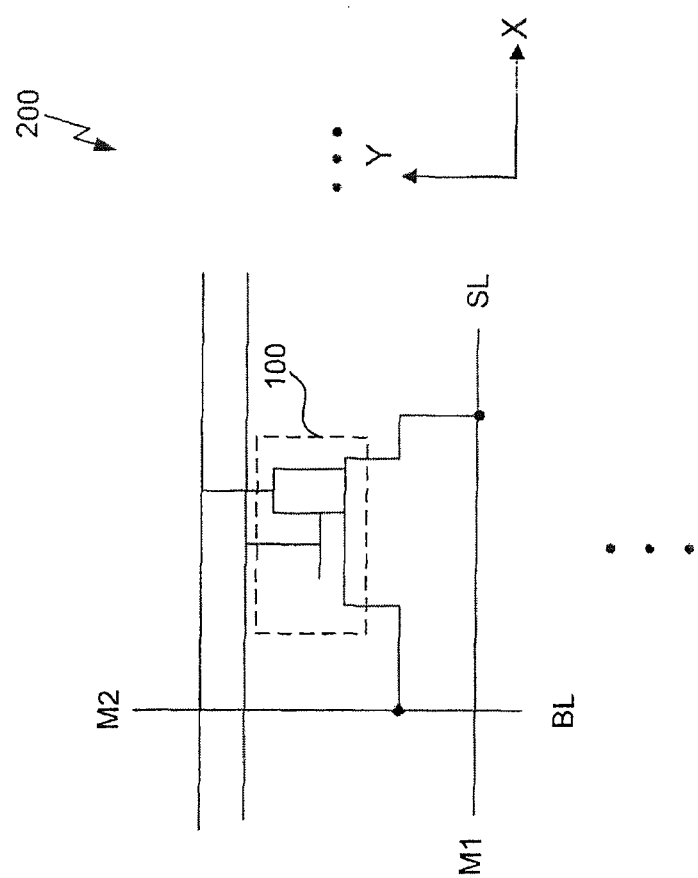
FIG. 2 is a circuit diagram of a memory cell in a memory array according to various embodiments.

FIG. 2 illustrates an example circuit diagram 200 that comprises a memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
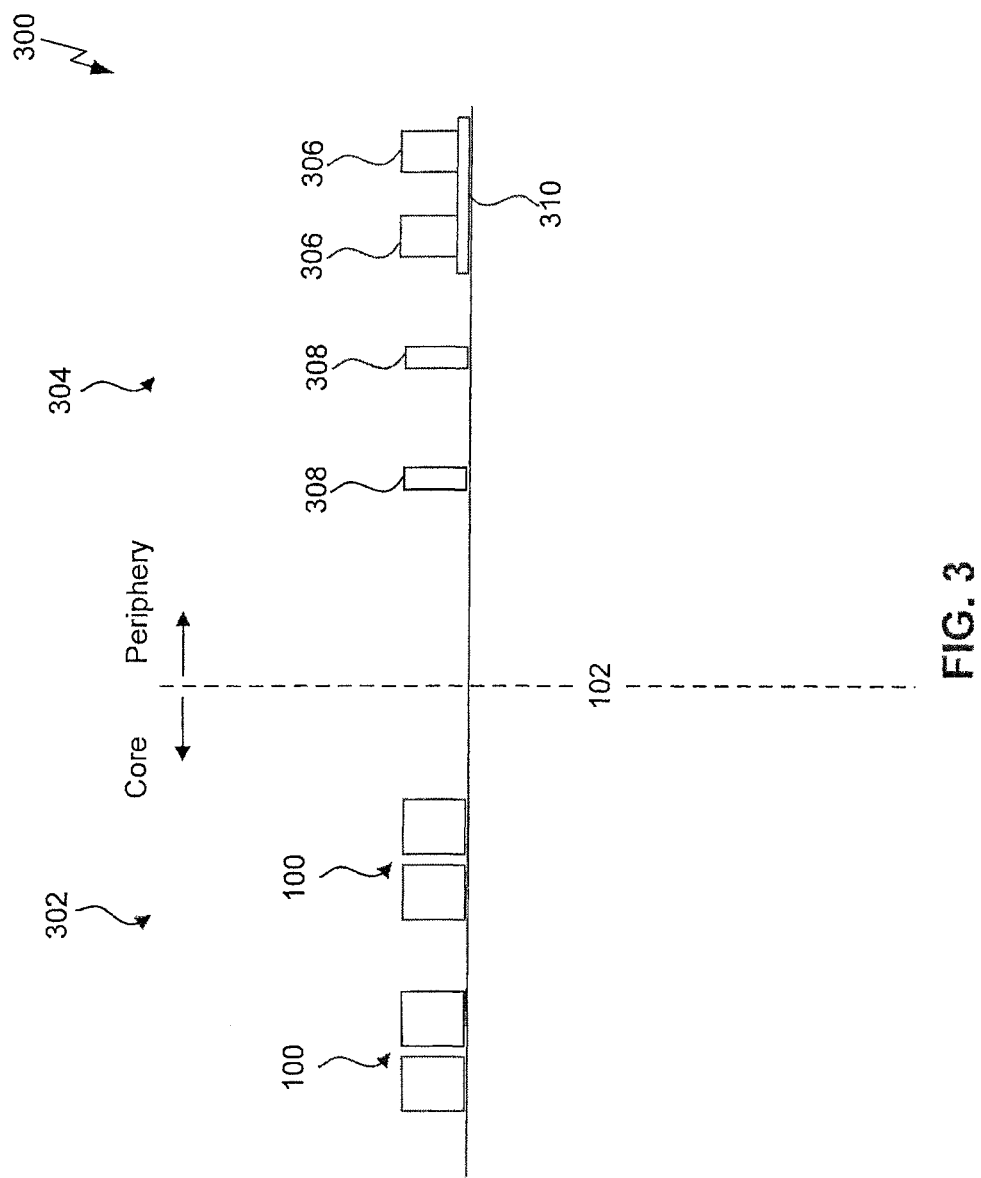
FIG. 3 depicts a cross-section of a semiconductor device according to various embodiments.

FIG. 3 illustrates an example semiconductor device 300 that includes both memory circuitry 302 and peripheral circuitry 304 in the same substrate 102. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Substrate 302—and indeed substrates in general as used throughout the description—can be silicon according to various embodiments. However, the substrate 302 may also be any of a wide array of semiconductor materials such as germanium, gallium arsenide, indium phosphide, etc. In other embodiments, the substrate 302 may be electrically non-conductive such as a glass or sapphire wafer.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308. As shown in FIG. 3, low voltage transistors 308 have a narrower width than high-voltage transistors 306, but this need not be the case. According to some embodiments, low-voltage 308 transistors can be wider than high voltage transistors 306 or, alternatively, low-voltage transistors 308 and high-voltage transistors 306 can have the same width.

During the descriptions herein, various regions of the substrate upon which the field-effect devices are fabricated are mentioned. For instance, with respect to FIG. 3, core region 302 and periphery region 304 were described. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

Figure 4:
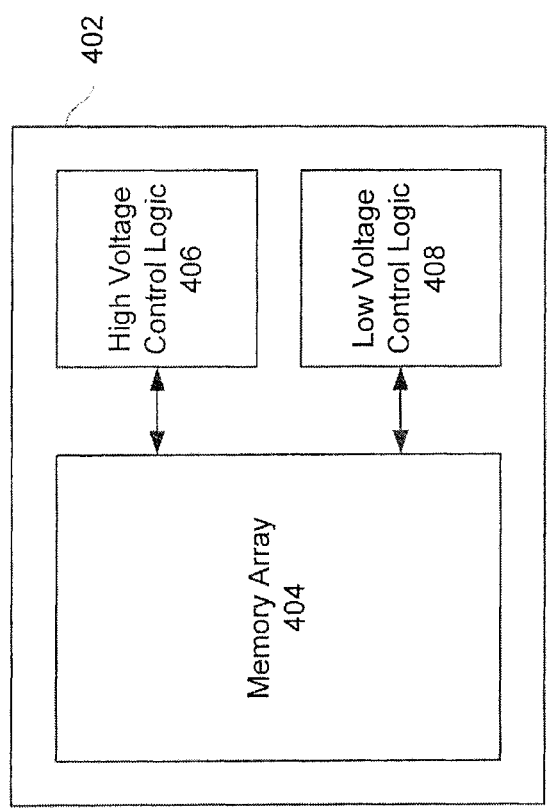
FIG. 4 is a functional block diagram of a semiconductor device according to various embodiments.

FIG. 4 is a functional block diagram of a semiconductor device 402 according to embodiments of the present invention. As shown, semiconductor device 402 includes a non-volatile memory array 404, high voltage control logic 406, and low voltage control logic 408. According to various embodiments, the memory array 404 may comprise a number of memory cells 100 and may be physically located in a core region 302 of semiconductor device 402. High voltage control logic 406 may comprise a number of high-voltage transistors 306, which can be used to control and/or drive portions of the memory array 404. Additionally, the high voltage control logic 406 may be physically located in the periphery 304 of the semiconductor device 402. Similarly to the high voltage control logic 406, the low voltage control logic 408 may comprise a number of low voltage transistors 308, which can be used to control and/or drive portions of the memory array 404. The low voltage control logic 408 may also be located in the periphery 304 of the semiconductor device. According to various embodiments, the high voltage control logic 406 and the low voltage control logic 408 are located in different portions of the periphery region 304. In addition, the low voltage control logic 408 may also include a micro-controller and analog circuits for control the operation of semiconductor device 402.

Figure 5A:
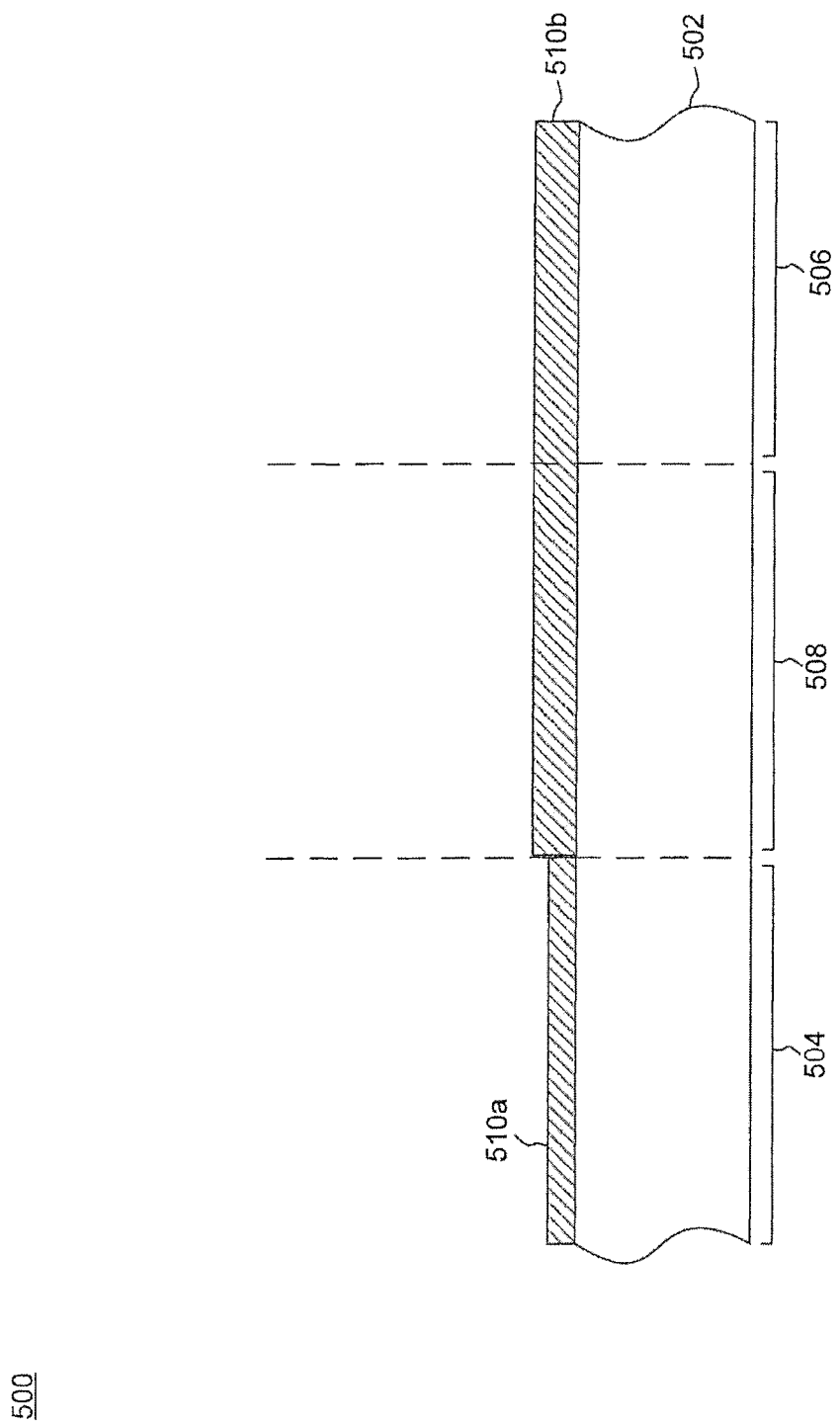
FIGS. 5A-5J depict a cross-section of a semiconductor device at several points during its manufacture according to embodiments.

FIGS. 5A-5J depict a cross-section of a semiconducting device 500 at various points during its manufacture according to embodiments of the present invention. FIG. 5A depicts semiconducting device 500 after several initial features have been formed. As depicted in FIG. 5A, the device 500 comprises a substrate layer 502 which is divided into several regions.

A first or memory region 504 of the substrate may be used for memory components. According to various embodiments, the first region 504 comprises a memory core region where a plurality memory cells 100 can be formed. For instance, according to some embodiments, the first region may be used to form a number of select gate 108/memory gate 110 pairs.

Logic and/or control circuitry may be formed in periphery, which includes second and third regions 506 and 508, respectively according to various embodiments. The second region 506 may comprise the high voltage control logic region 406 and the third region 508 may comprise the low voltage control logic region 408.

As shown in FIG. 5A, the gate dielectric 510a is formed (e.g., deposited) in first region 504 and gate dielectric 510b has been disposed in second region 506 and in third region 508. According to various embodiments the gate dielectrics 510a and 510b may be different thicknesses, but this need not be the case. The gate dielectrics 510a and 510b may be formed through any well-known method. For instance, the dielectrics 510a and 510b may be grown on the substrate 502. The dielectric 510a in the first region 504 may also be formed independently of dielectric 510b disposed in the second and third regions 506 and 508. It is also possible, however, for the gate dielectrics 510a and 510b to be disposed on the substrate and comprise an oxide of a different material than the substrate 502 or an oxide of the same material as the substrate 502. Additionally, dielectrics 510a and 510b may comprise the same or different material and may be formed at the same time or at different times according to various embodiments.

Figure 5B:
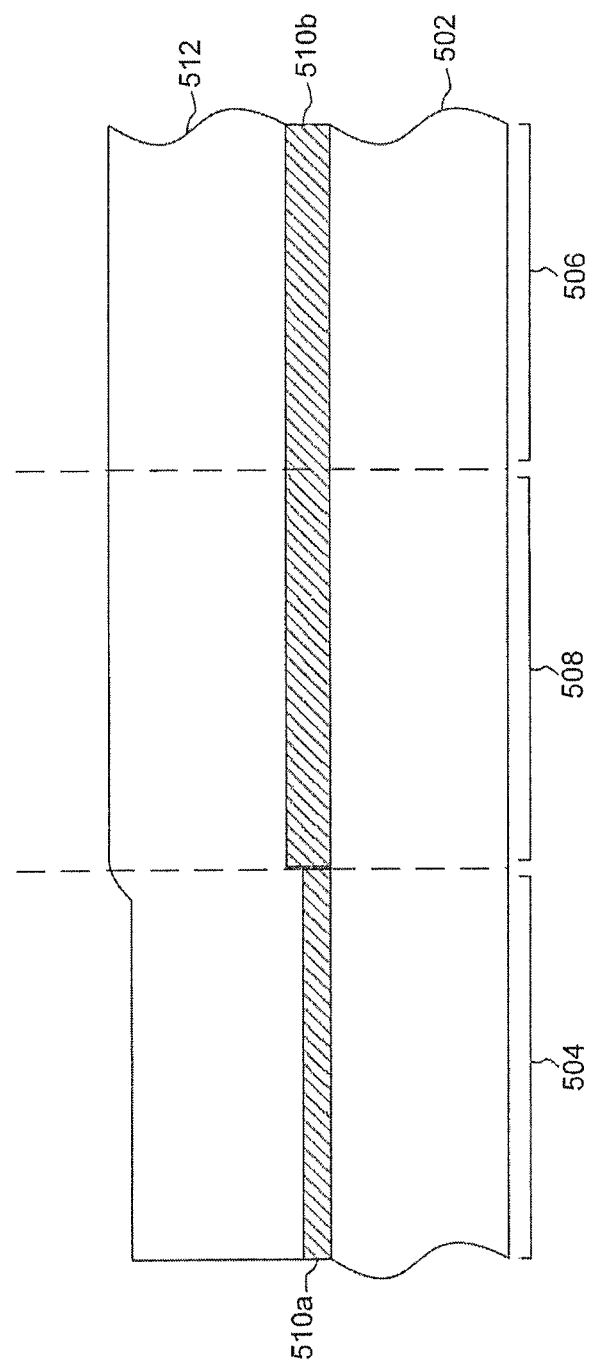

FIG. 5B depicts a cross section of device 500 after a layer of gate conductor 512 has been disposed. The gate conductor 512 may comprise any suitable conductor such as, for example, poly. As shown in FIG. 5B, the gate conductor layer 512 is disposed over the gate dielectric 510a in the first region 504 and over gate dielectric 510b in second region 506 and the third region 508.

Figure 5C:
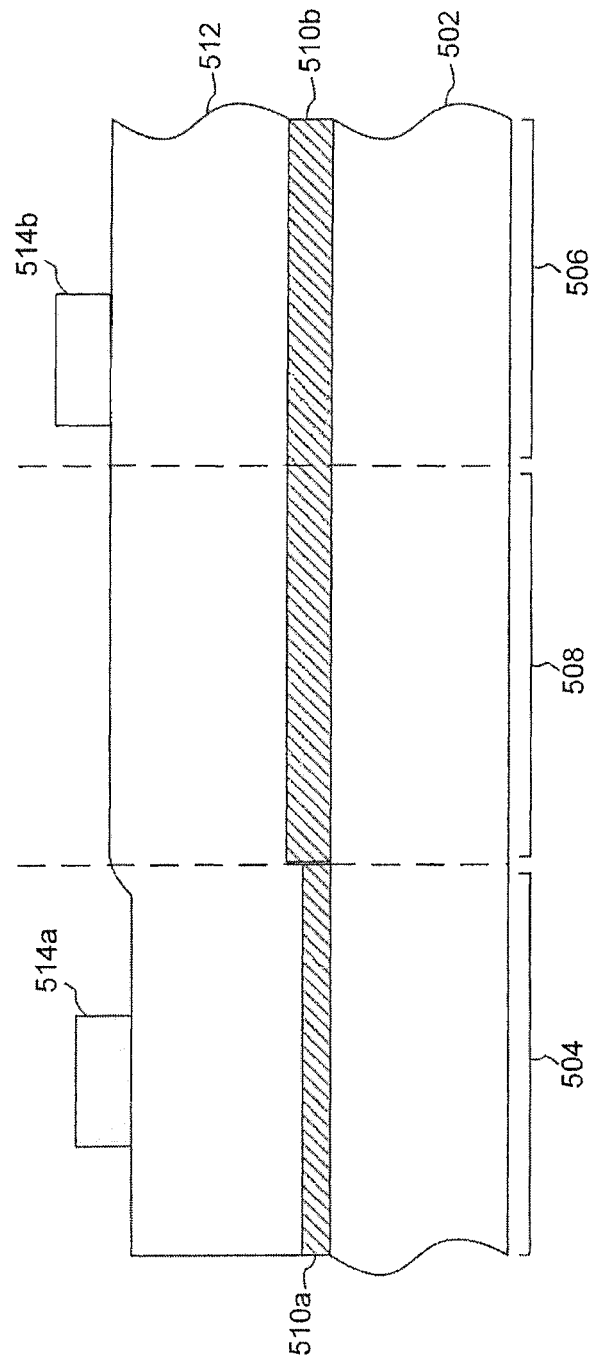

In FIG. 5C, a mask 514a is applied to the substrate over a portion of the gate conductor layer 512 disposed in the first region 504. Similarly, a mask 514b is disposed over a portion of the gate conductor layer 512 disposed in the second region 506. No mask is disposed in the third region. According to various embodiments, the masks 514a and 514b will be used to form a select gate in the first region 504 and a transistor gate in the second region 506. Masks 514a and 514b may comprise any appropriate material that allows for selective removal (e.g., etching) of the unmasked portion of the gate conductor layer 512. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Figure 5D:
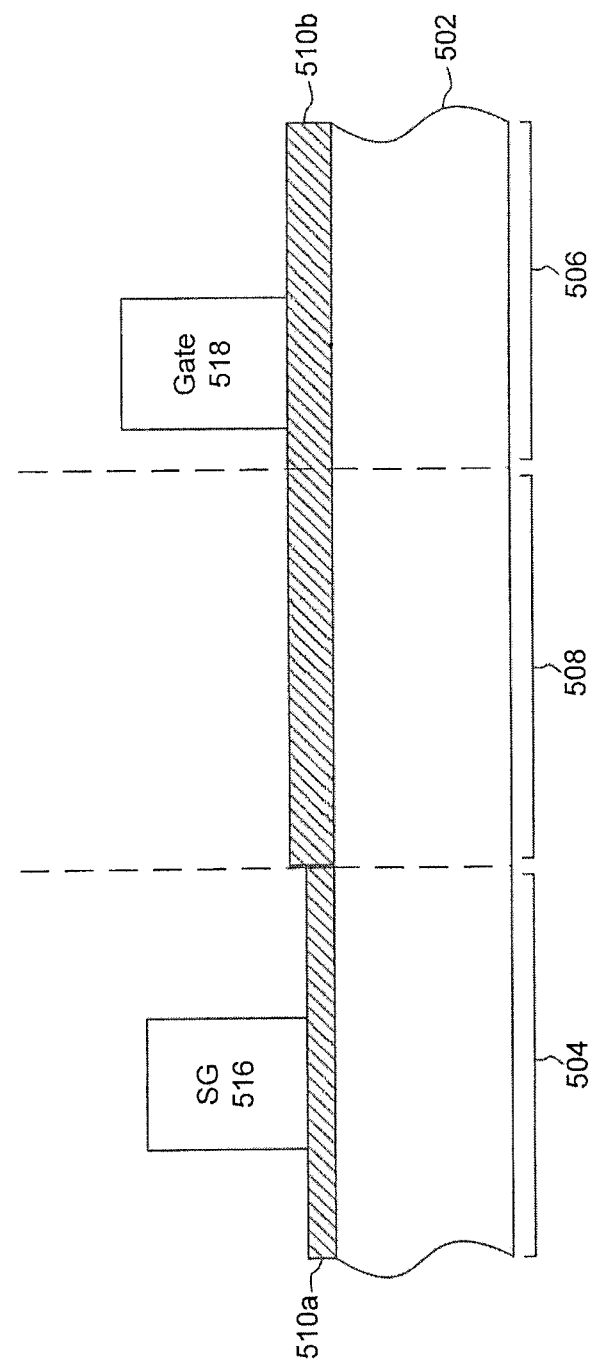

FIG. 5D depicts a cross section of device 500 after the unmasked portion of gate conductor layer 512 has been removed along with masks 514a and 514b. As can be seen in FIG. 5D, a select gate 516 has been formed in the first region 504 over gate dielectric 510a. Additionally, a second gate 518 has been formed in the second region 506 over gate dielectric 506. According to various embodiments, the gate conductor layer 512 can be removed by any appropriate method such as etching. According to various embodiments, the removed portion of the gate conductor layer 512 is removed using well-known etching methods. For instance, the gate conductor layer 512 may be etched using Cl2, KOH, TMAH (tetra-methyl-amino-hydroxyl), or using gas phase etching with, for instance, H2, HCl, O2, H2O (vapor or gas), O3, HF, F2, and Carbon-Fluoride compounds with Cl2 and XeF2. Additionally, according to some embodiments, a combination of etching products may be used.

Figure 5E:
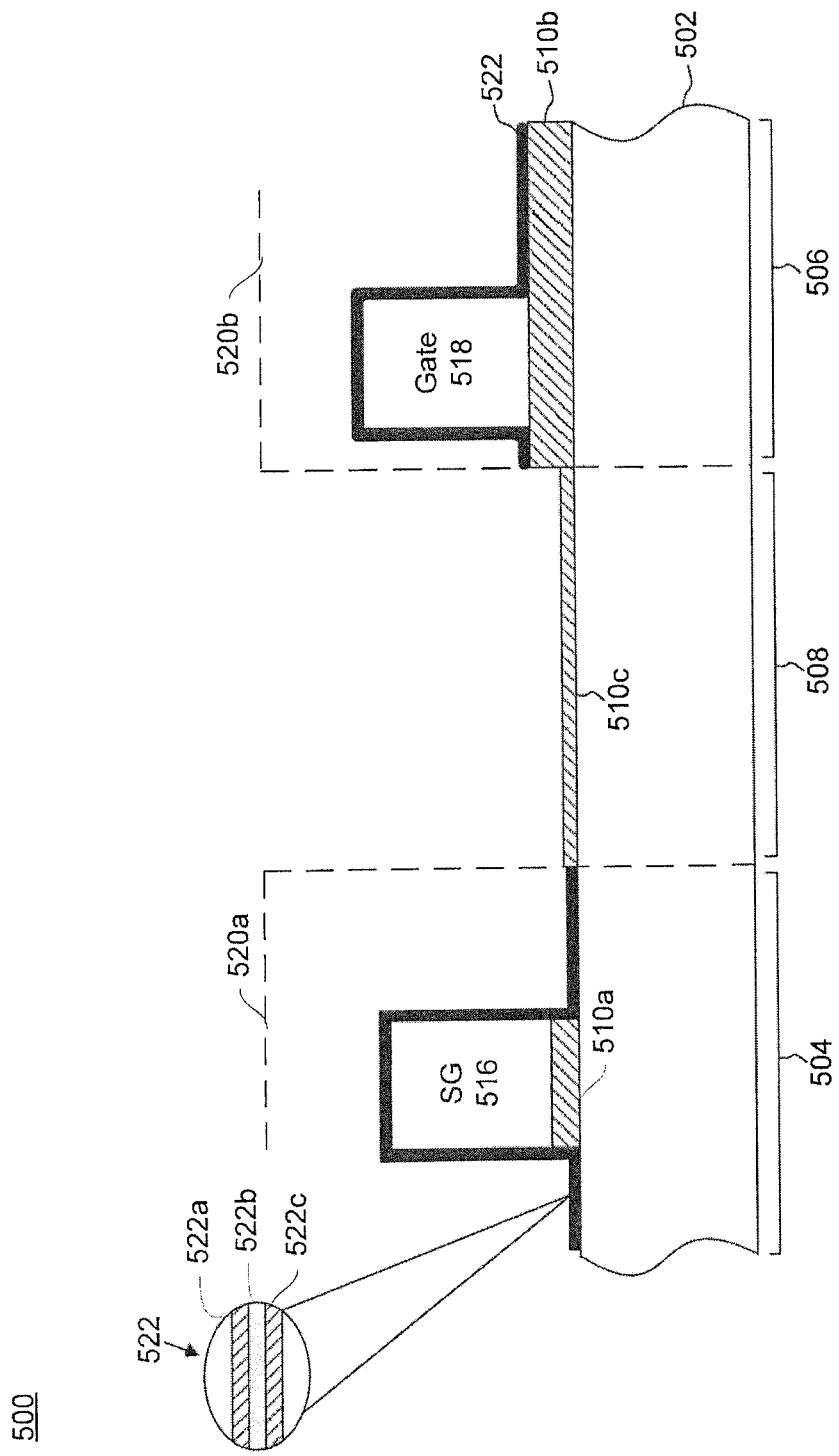

FIG. 5E depicts a cross section of device 500 after several additional structures have been formed according to various embodiments. As shown in FIG. 5E, the portion of dielectric 510a which is non-covered by SG 516 in first region was first removed, and a charge trapping dielectric 522 was disposed over the entire device 500. According to various embodiments, the charge trapping dielectric comprises one or more layers of dielectric such as ONO, as described above. For instance, the charge trapping dielectric 522 may comprise a first dielectric layer 522a, a nitride layer 522b, and a second dielectric layer 522c. According to various embodiments the first dielectric layer 522a and the second dielectric layer 522c may comprise any suitable dielectric, such as an oxide. Regardless of the specific composition of the charge trapping dielectric 522, it preferably contains at least one charge trapping layer such as nitride layer 522b. The charge trapping layer may be formed of a nitride, silicon rich nitride, and may include multiple layers of different nitrides according to some embodiments. A masking layer 520 has also been formed to cover the first region 504 and second region 506. The charge trapping dielectric 522 and dielectric 510b in the third region 508 were removed by etch method. Finally, a gate dielectric 510c has been formed over the portion of the substrate 502 disposed in the third region 508, after masking layer 520 is removed.

Figure 5F:
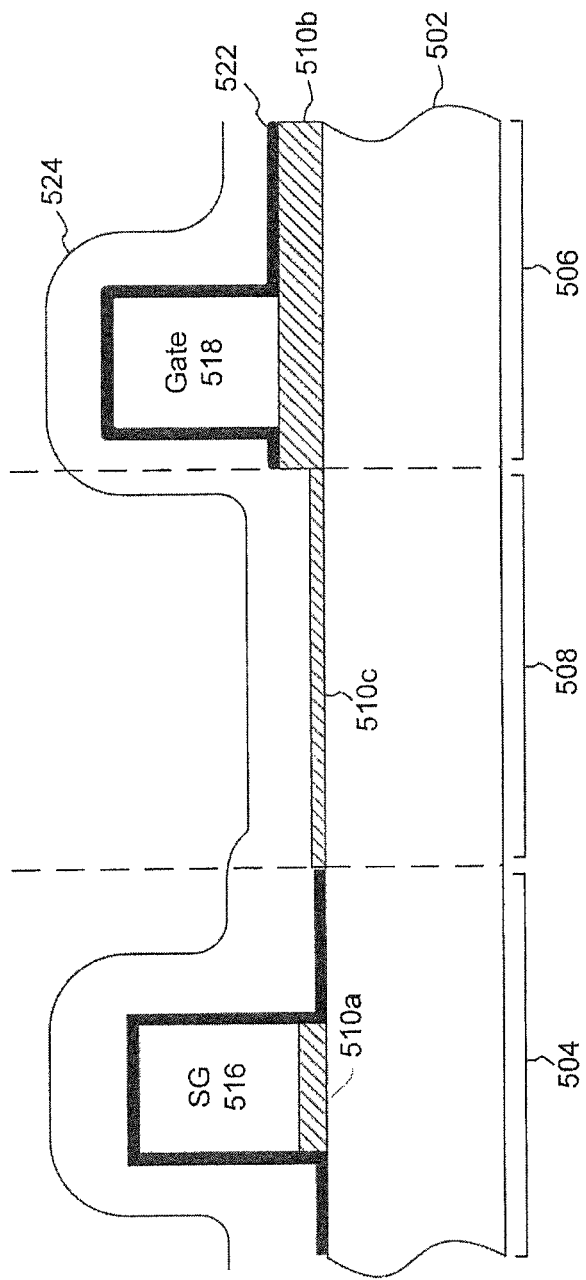

FIG. 5F depicts a cross section of device 500 at a later stage during the manufacturing process. As shown in FIG. 5F, a second gate conductor layer 524 has also been disposed in all three regions 505, 506, and 508 of the device 500. According to some embodiments, the second gate conductor layer 524 is thinner than the previously-deposited gate conductor layer 512. Additionally, the second gate conductor layer 524 may be disposed so that it is substantially conformal to the device 500.

Figure 5G:
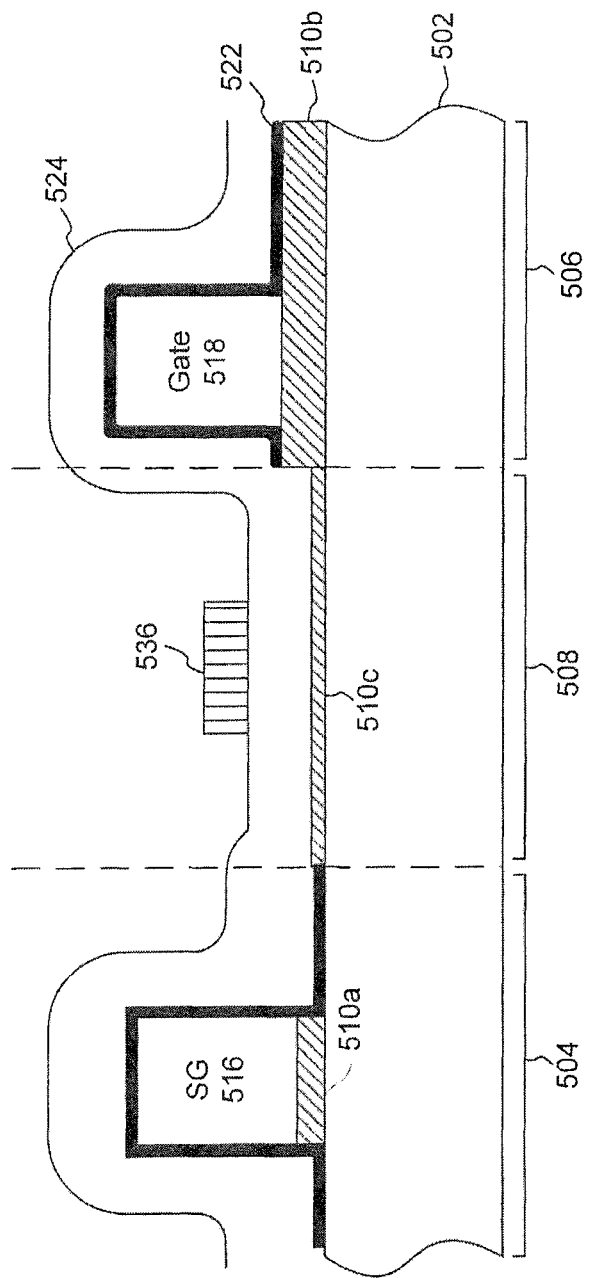

FIG. 5G depicts a cross section of device 500 at a later stage of the manufacturing process according to various embodiments. As shown in FIG. 5G, a mask 536 has been disposed over a portion of the second gate conductor layer 524 that is disposed in the third region 508. The portions of the second gate conductor 524 that are disposed in the first region 504 and in the second region 506 remain unmasked.

Figure 5H:
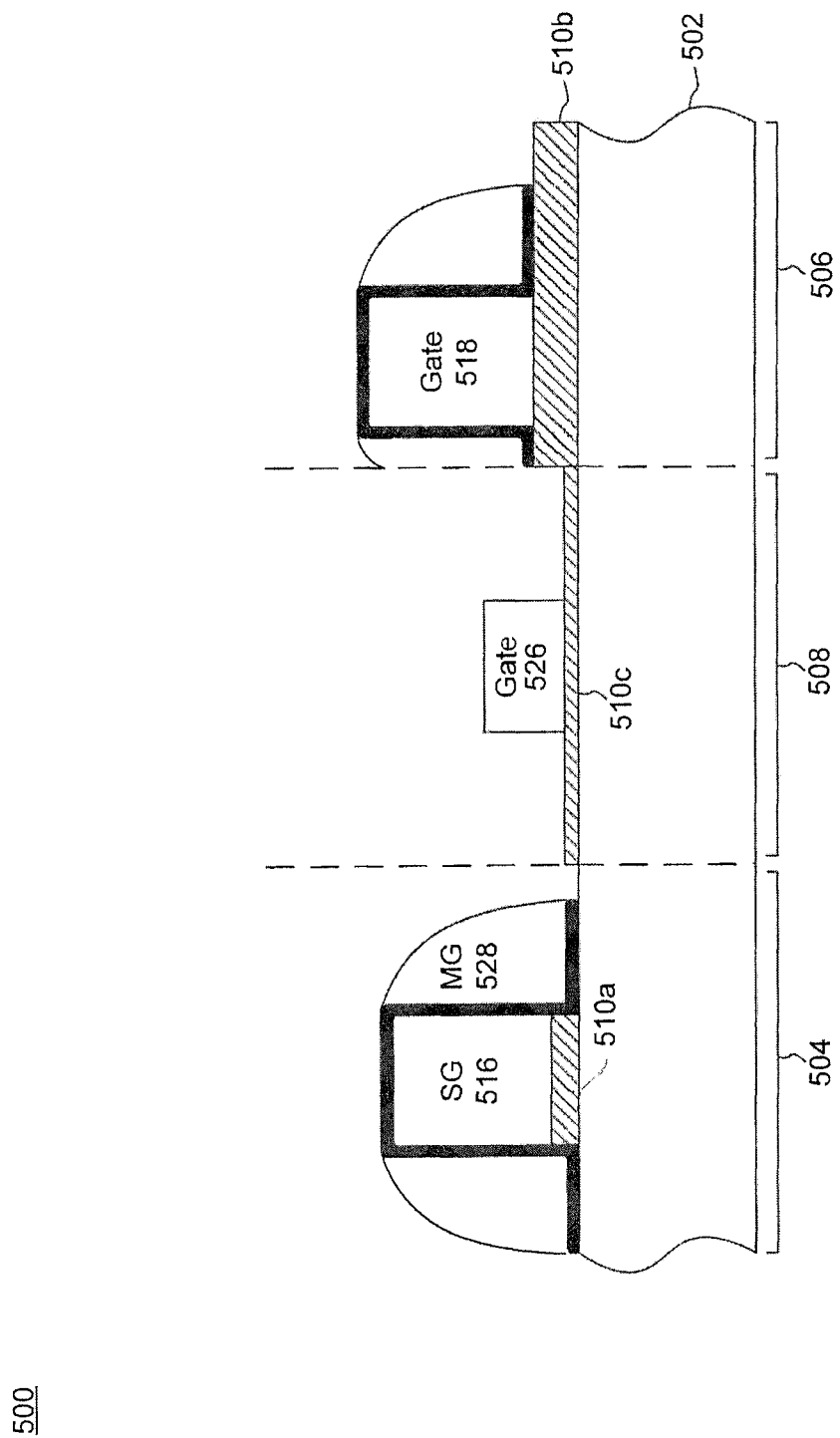

FIG. 5H depicts a cross section of device 500 after a portion of the second gate conductor layer has been removed by, for instance, etching. As shown, removal of the second gate conductor layer 524 has formed a gate 526 over the dielectric 510c in the third region 508. Additionally, a portion 528 of the second gate conductor layer 524 has remained disposed on the sidewalls of the select gate 516 and gate 518. According to various embodiments, one of the portions 528 will be used as a memory gate for memory a memory cell 100 in the first region 504.

Figure 5I:
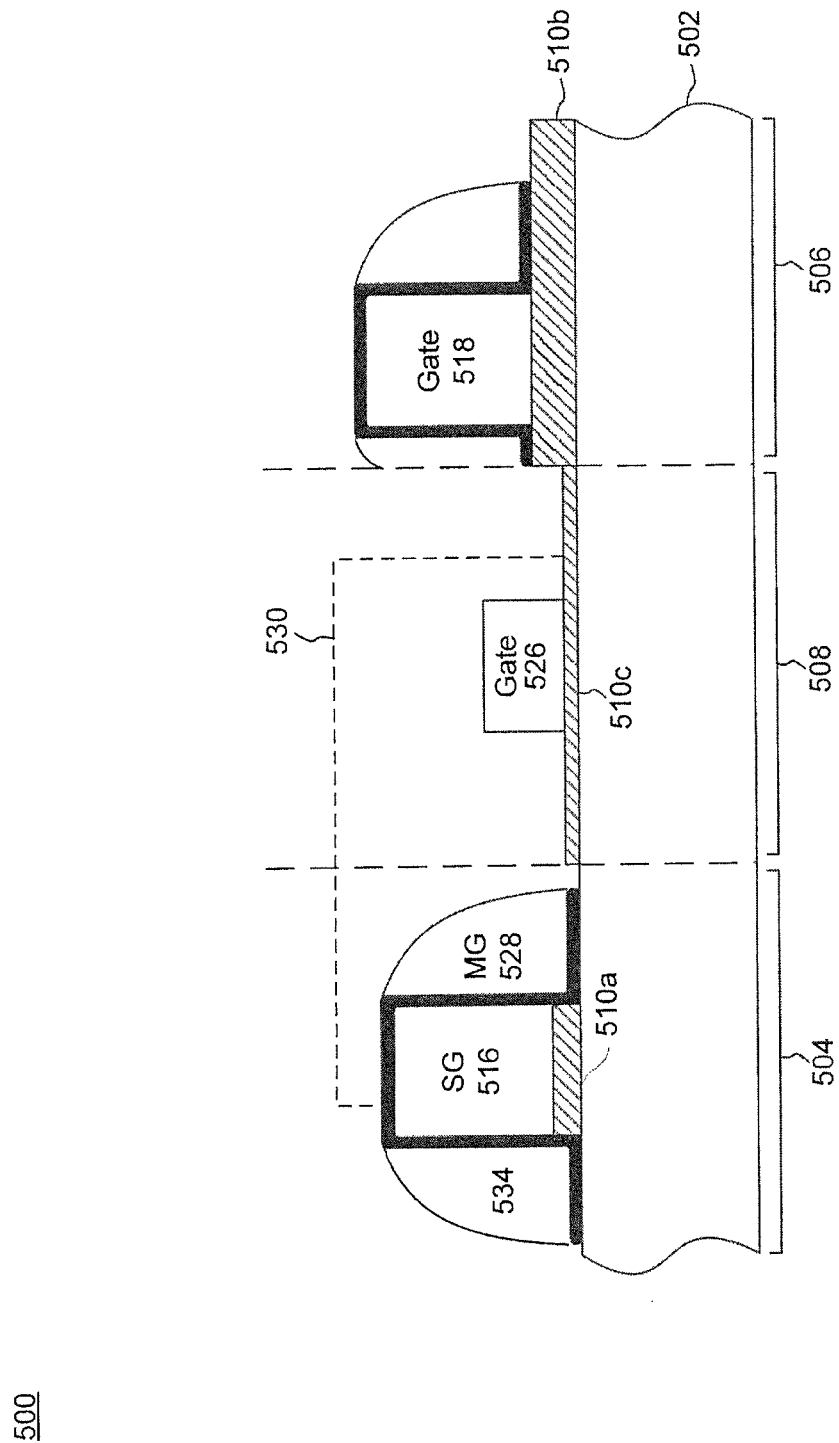

FIG. 5I depicts a cross section of device 500 at a later stage of the production process. As shown in FIG. 5I, the portion 528 disposed on the right sidewall of the select gate 516 will be used as the memory gate for the memory cell 100 disposed in the first region 504. Accordingly, the memory gate 528 has been masked by mask 530 along with a portion of the third region 508 containing the gate 526, which is formed of the second gate conductor. This masking will allow further removal of the second gate conductor 524 from the left side of the select gate 516 (as indicated by reference number 534) and from sidewalls of gate 518.

Figure 5J:
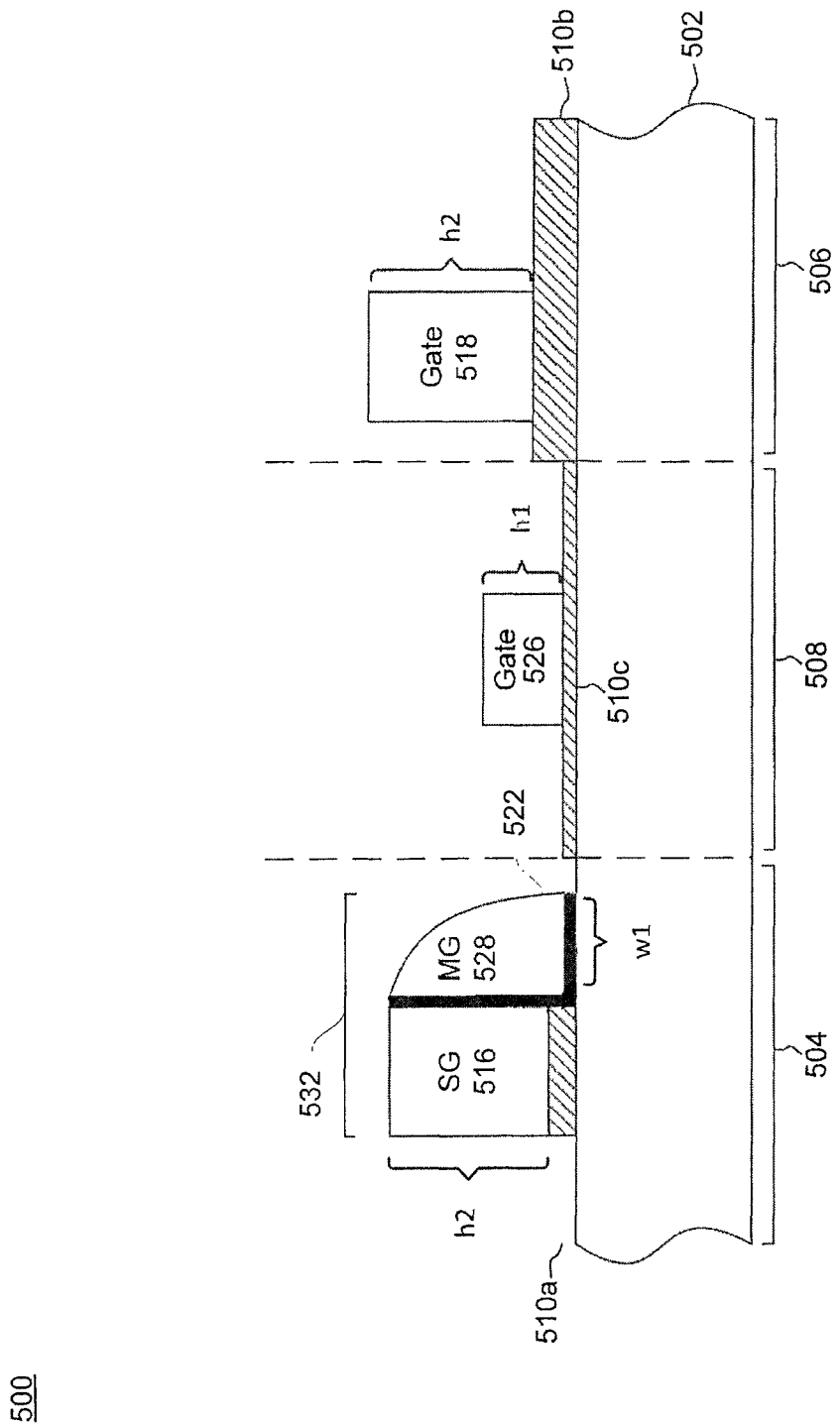

FIG. 5J depicts a cross section of device 500 according to various embodiments. As shown in FIG. 5J, the remaining portion 528 of the second gate conductor 524 has been removed (e.g., etched) from the left sidewall of the select gate 516 and from both sidewalls of gate 518. Additionally, the charge trapping dielectric 522 has been removed from all portions of the device except the portion of the device separating the memory gate 528 from the substrate 502 and the select gate 516.

As can be seen in FIG. 5J, the device 500 contains a split-gate non-volatile memory cell 532 that includes a select gate 516, a memory gate 528, and a charge trapping dielectric. As explained above, the charge trapping dielectric may comprise several dielectric layers. For instance, the charge trapping dielectric may include a nitride layer sandwiched between two dielectric layers according to various embodiments. In such a scenario, the nitride layer may function as the charge trapping layer. That is, the nitride layer may function to trap charge within the dielectric to store a value for the memory cell.

Because gate 526 and memory gate 528 were formed from the same layer of gate conductor—the second gate conductor layer 524 in this case—the height h1 of gate 526 is substantially the same as the width w1 of the memory gate 528 at its base according to various embodiments. Additionally, since the select gate 516 and gate 518 are formed of the same gate conductor layer 510, they may have substantially the same height h2 according to various embodiments. Since gate conductor layer 512 and gate conductor layer 524 were deposited at different time, thickness of h1 and h2 can be either the same or different. In addition, each gate conductor layer 512 and 524 are formed by a single gate conductor deposition separately.

Figure 6A:
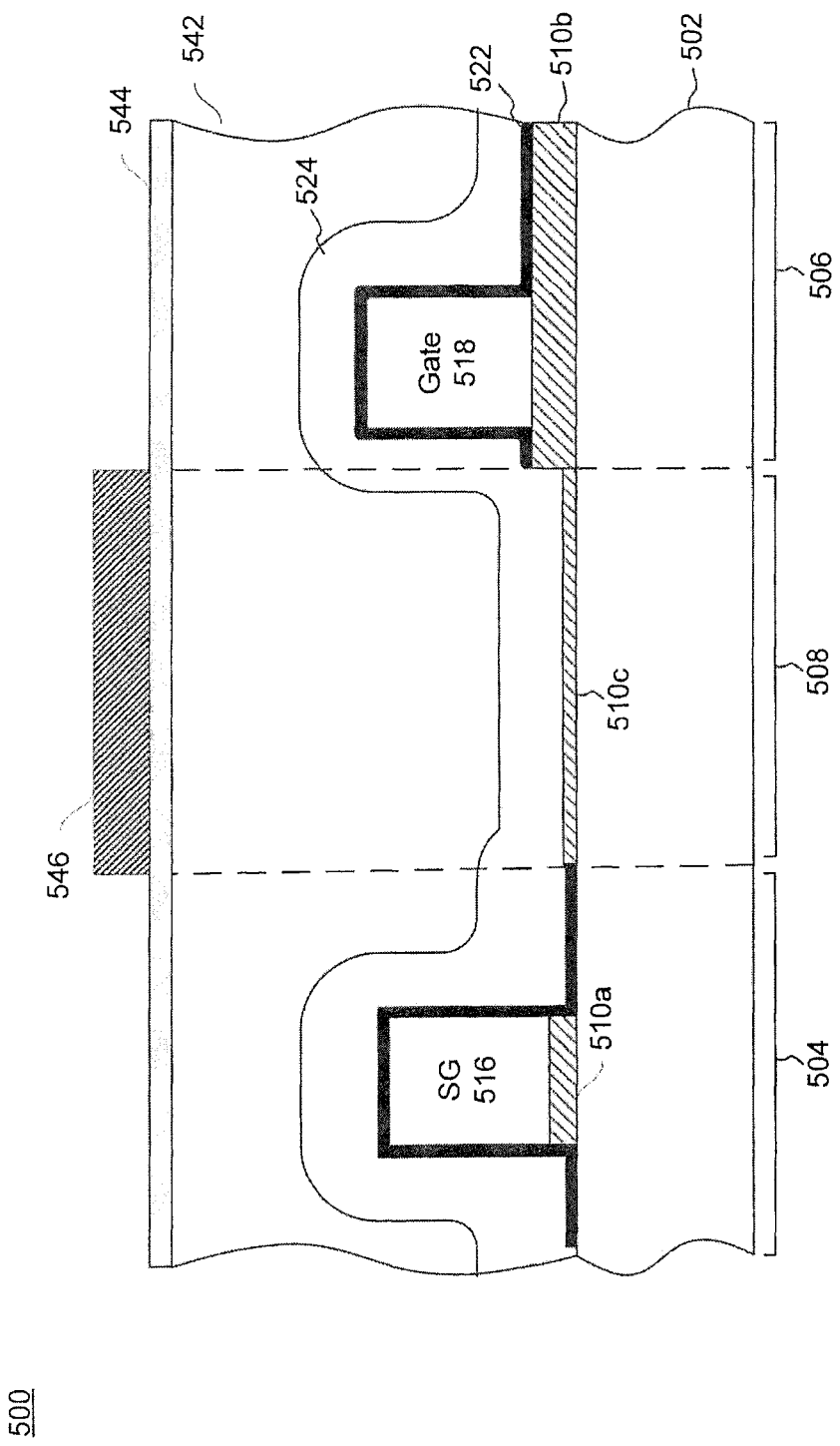
FIGS. 6A-6D depict a cross section of a semiconductor device at several points during its manufacture according to embodiments.

According to some embodiments, an alternative to the process shown in FIG. 5G may be performed subsequent to the process step depicted in FIG. 5F. This alternative "hard mask" process is described with respect to FIGS. 6A-6D. FIG. 6A depicts device 500 after the steps described with respect to FIG. 5F have been performed. Additionally, a first hard mask layer 542 is formed on top of gate conductor layer 524. A second hard mask layer 544 can be formed over the first hard mask layer 542. Together, hard first and second hard mask layers 542 and 544 can be termed a "hard mask stack." A mask 546 is formed to cover the third region 508. As shown in FIG. 6A, mask 546 covers the entirety of the third region, but this need not be the case.

Figure 6B:
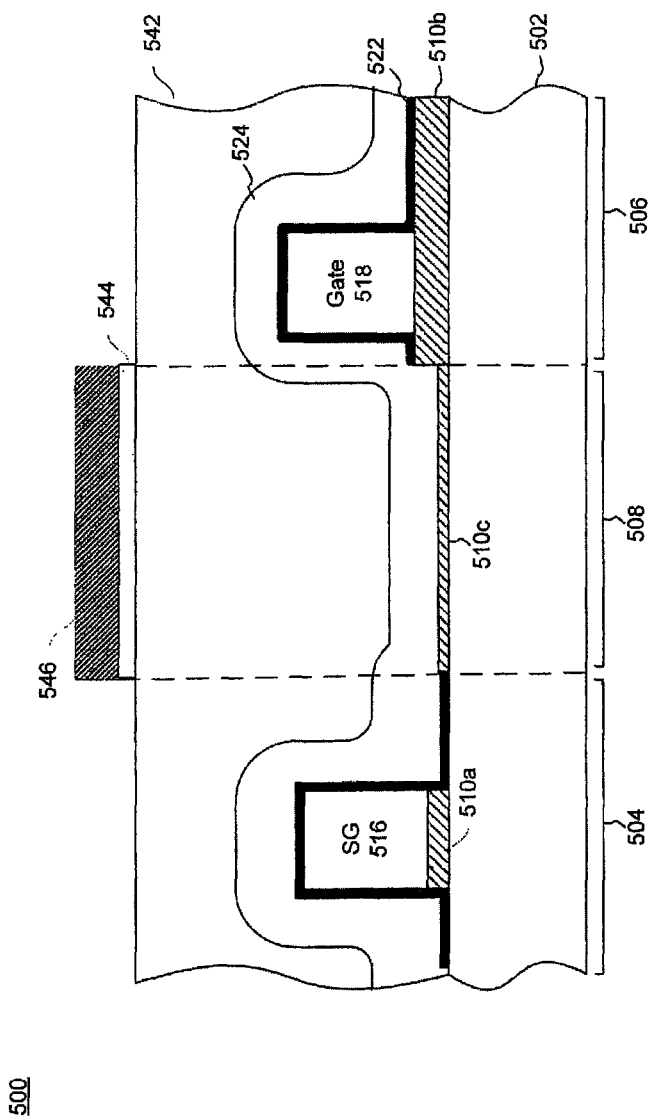

In FIG. 6B depicts a cross section of device 500 after the portion of the second hard mask 544 that was not itself masked by mask 546 has been removed by, e.g., etching.

Figure 6C:
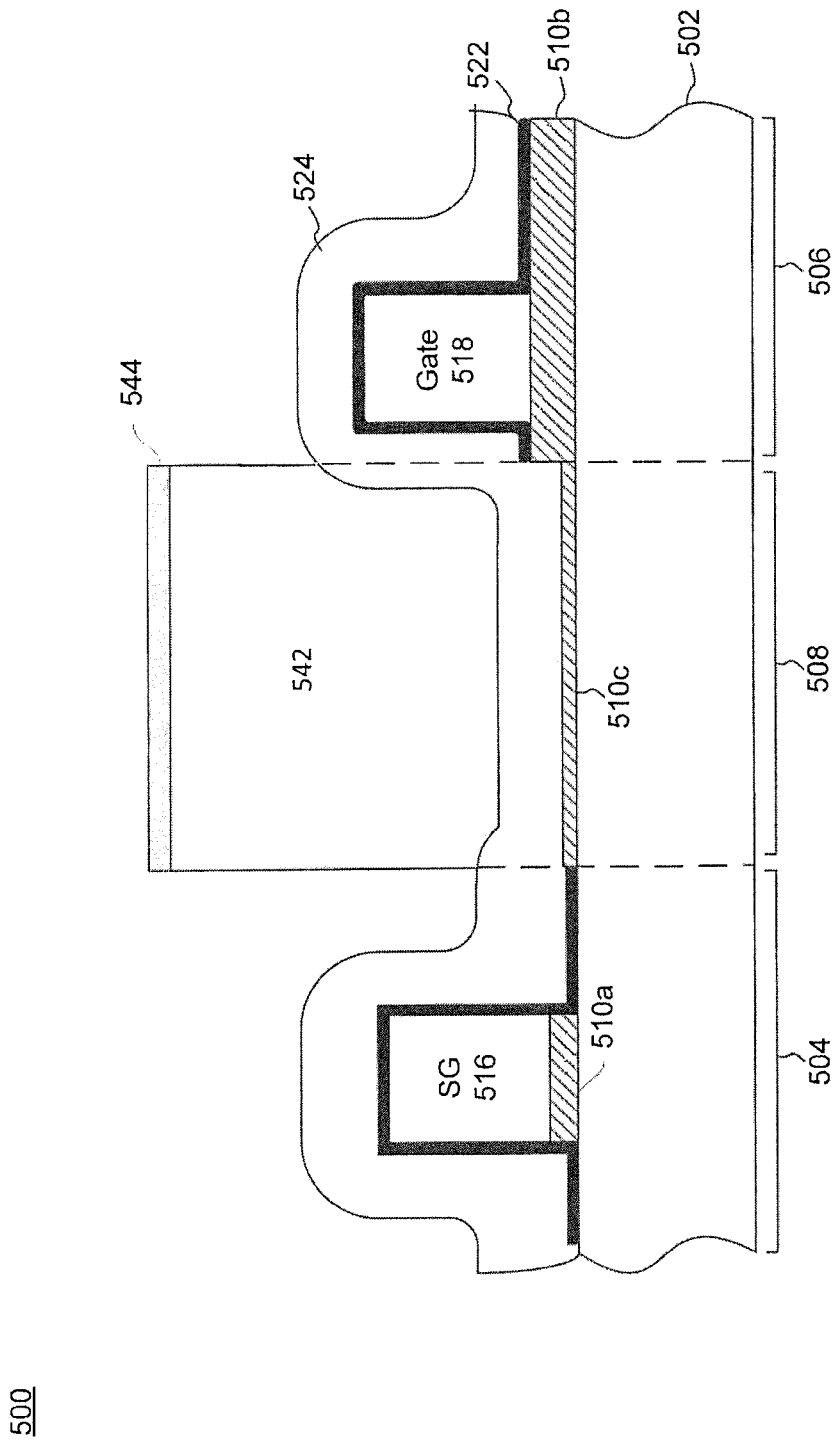

FIG. 6C depicts a cross section of device 500 after the mask layer 546 has been removed. Additionally, the portion of the hard mask stack 542 and 544 that was in the first and second regions 504 and 506 has been removed. That is, the hard mask stack 542 and 544 only remains in the third region 508.

Figure 6D:
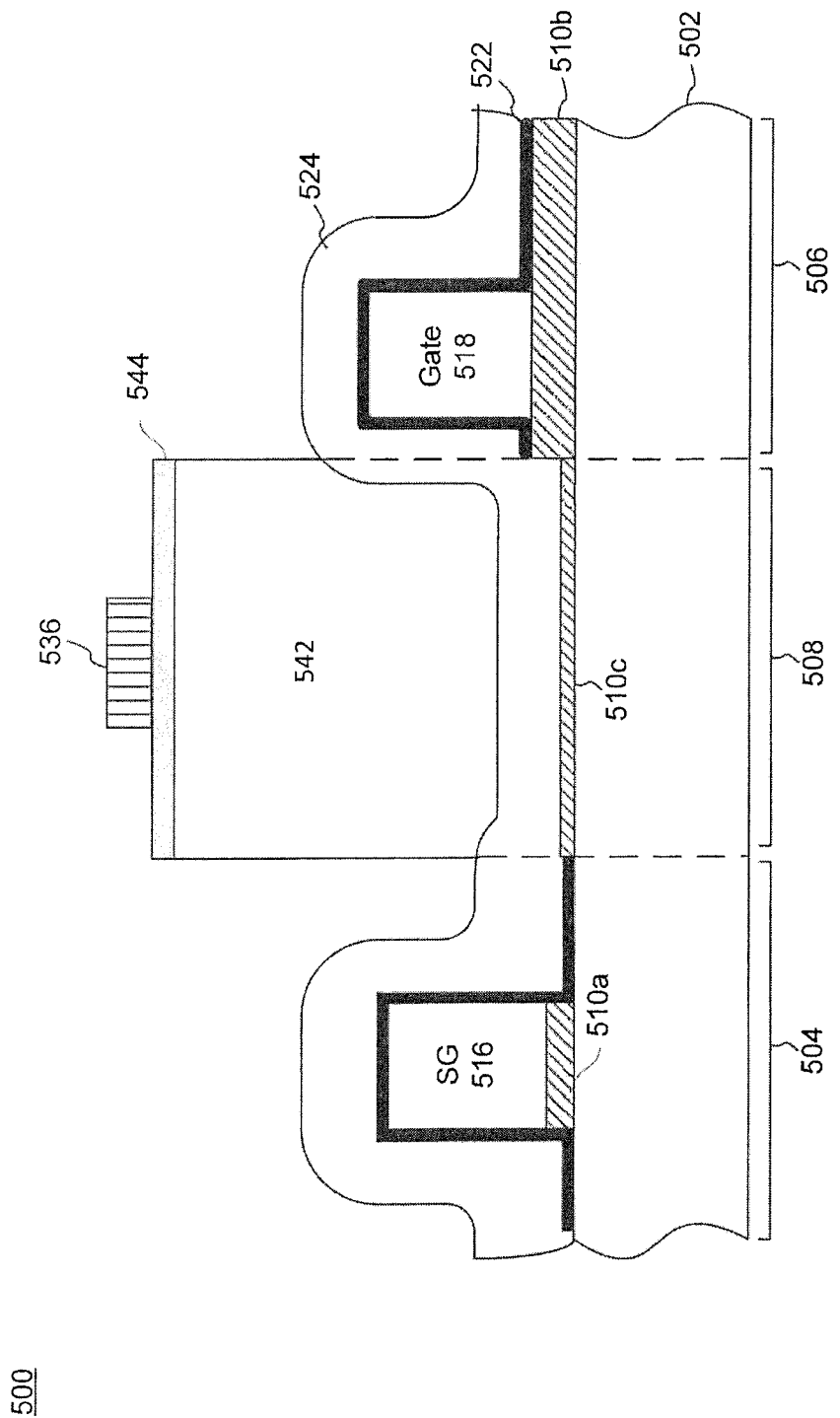

FIG. 6D, depicts a cross section of device 500 after the forming of a mask 536 over the remaining hard mask layers 542 and 544 in the third region 508. The portions of the second gate conductor 524 that are disposed in the first region 504 and in the second region 506 remain unmasked and can be removed at later steps illustrated in FIG. 5H.

Figure 7:
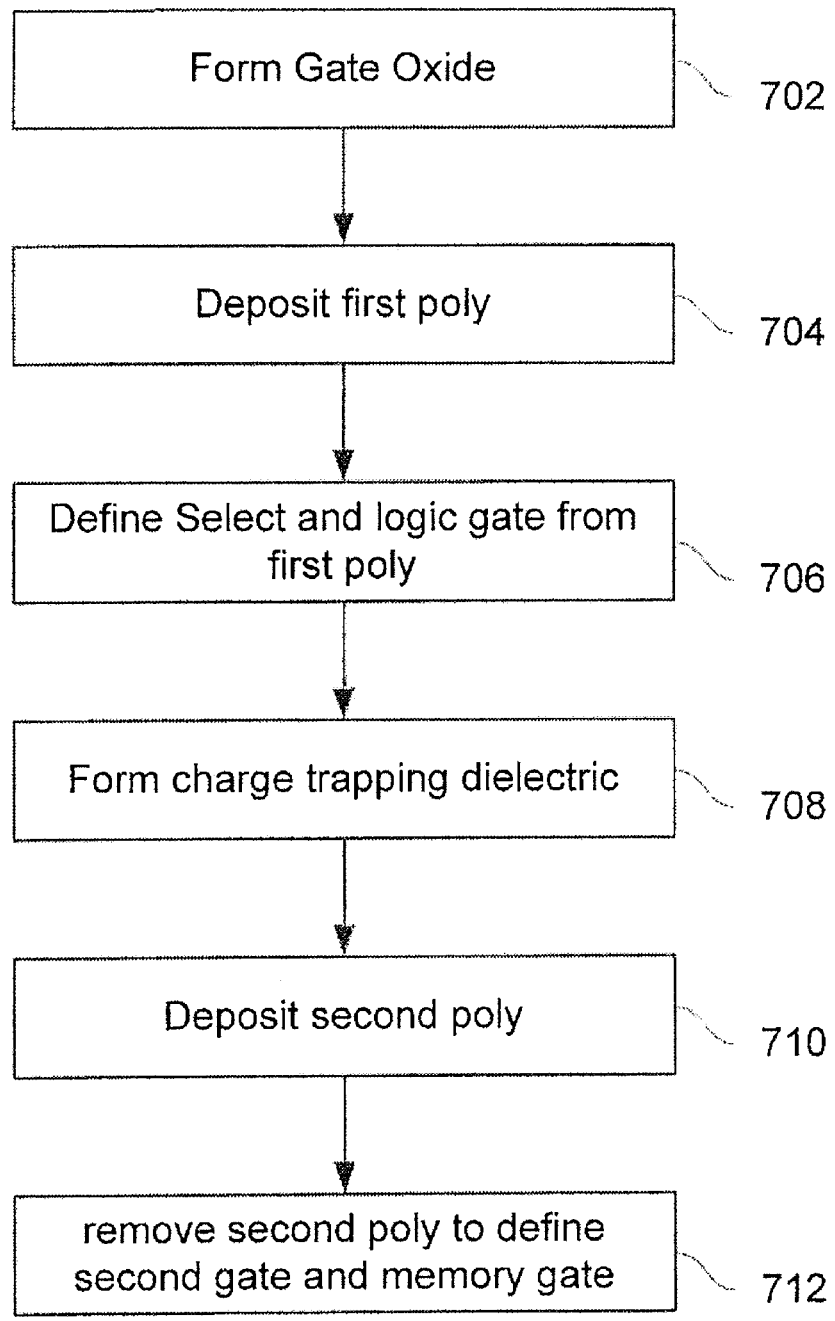
FIG. 7 is a flowchart depicting a method of manufacturing a semiconductor device according to embodiments.

FIG. 7 is a flowchart depicting a method 700 of manufacturing a semiconductor device 500 according to various embodiments of the invention. Method 700 will be described with simultaneous reference to FIGS. 5A-5J for ease of understanding. It should be understood, however, that method 600 is not so limited to the embodiments depicted in FIGS. 5A-5J.

As shown in FIG. 7, a gate dielectric is formed at step 702. According to various embodiments, the gate dielectric 510b is formed on entire surface of semiconductor device 500. A masking and etch step is performed to remove gate dielectric 510b from the first region 504, and followed by gate dielectric growth 510a in first region 504. At this step, both the second region 506 and third region 508 have gate dielectric 510b, while first region 504 has gate dielectric 510a. Additionally, the gate dielectric formed in each of the regions could be the same or different. For instance, according to some embodiments the gate dielectric 510a formed in the first region 504 could be thinner than the gate dielectric 510b. However, it is also possible to form a gate dielectric that is consistent throughout all of the three regions 504, 506, and 508.

At step 704, a first layer of gate conductor 512 is disposed on the semiconductor device 500. As noted above, the first layer of gate conductor 512 may be disposed using any appropriate method such as through deposition. According to some embodiments, the gate conductor layer 512 can be disposed conformally over the already-formed structures. For instance, the gate conductor layer 512 can be disposed conformally over gate dielectric 510*a* in the first region 504 and over 510*b* in the second region 506 and third region 508.

At step 706, a select gate 516 and a logic gate 518 are defined from the first gate conductor layer 512. According to various embodiments, this can be accomplished by forming a mask 514*a* in the first region 504 over the first gate conductor layer 512 and forming a mask 514*b* over the first gate conductor layer 512. The masks 514*a* and 514*b* can be used to define the select gate and logic gate, respectively, as the first gate conductor layer 512 is masked.

At step 708, a charge trapping dielectric 522 is formed on device 500. According to various embodiments, the charge trapping dielectric may be formed over all three regions 504, 506, and 508 of device 500. Additionally, the charge trapping dielectric may be formed of one or more dielectric layers. For instance, the charge trapping dielectric 522 may comprise a first dielectric layer 522*a*, a nitride layer 522*b*, and a second dielectric layer 522*c*. Regardless of the specific composition of the charge trapping dielectric 522, it preferably contains at least one charge trapping layer such as nitride layer 522*b*. The charge trapping layer may be formed of a nitride, silicon rich nitride, and may include multiple layers of different nitrides according to some embodiments. Prior to forming the charge trapping dielectric 522 it is possible to remove the portion of dielectric 510*a* left uncovered by select gate 516 from the first region.

At step 710, a second gate conductor layer 524 can be disposed in all three regions 504, 506, and 508 by, for instance, deposition. The second gate conductor layer 524 may be thinner than the first gate conductor layer 512. The second gate conductor layer 524 can then be removed (e.g., etched) at step 712 to define a second logic gate 526 in the third region 508. Additionally a memory gate 528 may be defined from the second gate conductor layer 524. Preferably, the memory gate 526 is formed on the sidewall from of the select gate 516 and is separated from the select gate 516 by the charge trapping dielectric 522. Additionally, the memory gate 526 is separated from the substrate 502 by charge trapping dielectric 522. Together the select gate 516, charge trapping dielectric, and the memory gate 526 form a split-gate non-volatile memory cell 532. Additionally, because the memory gate 528 and the logic gate 526 were formed from the same layer of gate conductor 524, the height of gate 526 is substantially the same as the width of the memory gate 528 at its base. Similarly, because select gate 516 and gate 518 were formed from the same layer of gate conductor 512, they have substantially the same height according to various embodiments. Step 610 may also include a masking and etch step is in order to cover the first and second region, and remove the charge trapping dielectric layer 522 and gate dielectric 510*b* from the third region.

Figure 8:
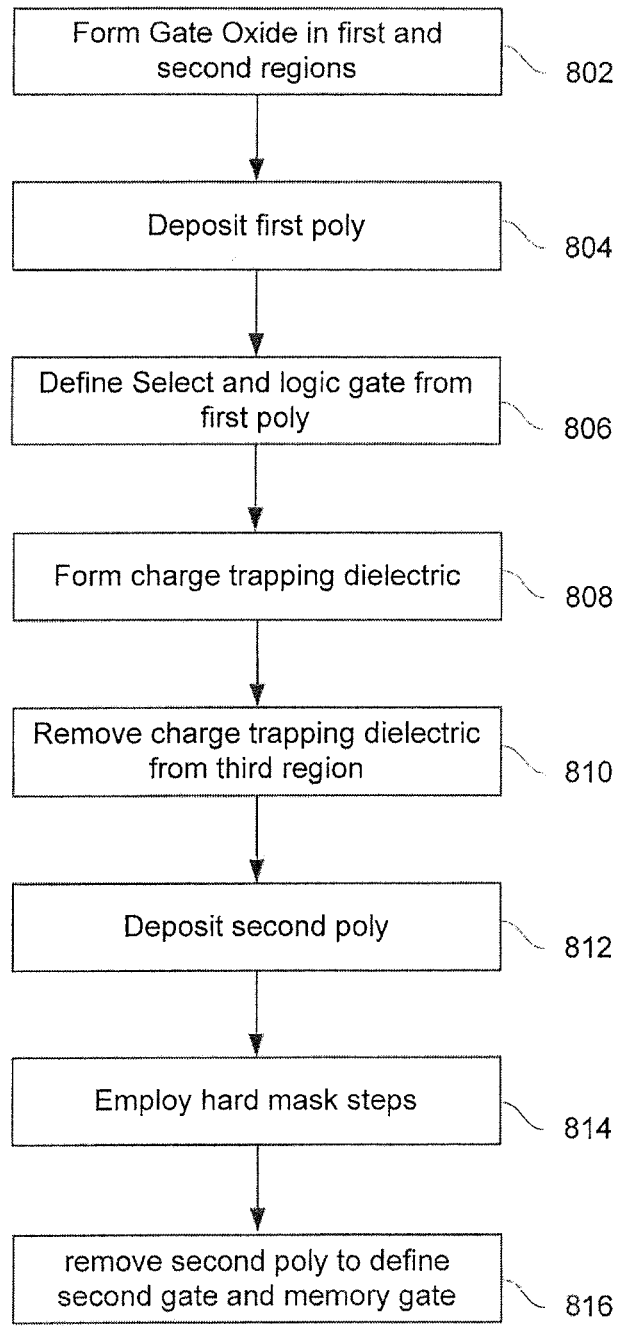
FIG. 8 is a flowchart depicting a method of manufacturing a semiconductor device according to embodiments.

FIG. 8 is a flowchart depicting a method 800 of manufacturing a semiconductor device 500 according to various embodiments of the invention. Similarly to the description of method 700, method 800 will be described with simultaneous reference to FIGS. 5A-5J for ease of understanding. It should be understood, however, that method 800 is not so limited to the embodiments depicted in FIGS. 5A-5J.

As shown in FIG. 8, the gate dielectric 510*b* is formed at step 802 over entire surface of semiconductor device 500. A masking and etch step is performed to remove gate dielectric 510*b* from the first region 504, and followed by gate dielectric growth 510*a* in first region 504. At this step, both the second region 506 and third region 508 have gate dielectric 510*b*, while first region 504 has gate dielectric 510*a*. Additionally, the gate dielectric formed in each of the regions could be the same or different. For instance, according to some embodiments the gate dielectric 510*a* formed in the first region 504 could be thinner than the gate dielectric 510*b*. However, it is also possible to form a gate dielectric that is consistent throughout all of the three regions 504, 506, and 508.

At step 804, a first layer of gate conductor 512 is disposed on the semiconductor device 500. As noted above, the first layer of gate conductor 512 may be disposed using any appropriate method such as through deposition. According to some embodiments, the gate conductor layer 512 can be disposed conformally over the already-formed structures. For instance, the gate conductor layer 512 can be disposed conformaly over gate dielectric 510*a* in the first region 504 and over 510*b* in the second region 506 and third region 508.

At step 806, a select gate 516 and a logic gate 518 are defined from the first gate conductor layer 512. According to various embodiments, this can be accomplished by forming a mask 514*a* in the first region 504 over the first gate conductor layer 512 and forming a mask 514*b* over the first gate conductor layer 512. The masks 514*a* and 514*b* can be used to define the select gate and logic gate, respectively, as the first gate conductor layer 512 is masked.

At step 808, a charge trapping dielectric 522 is formed on device 500. According to various embodiments, the charge trapping dielectric may be formed over all three regions 504, 506, and 508 of device 500. Additionally, the charge trapping dielectric may be formed of one or more dielectric layers. For instance, the charge trapping dielectric 522 may comprise a first dielectric layer 522*a*, a nitride layer 522*b*, and a second dielectric layer 522*c*. Regardless of the specific composition of the charge trapping dielectric 522, it preferably contains at least one charge trapping layer such as nitride layer 522*b*. The charge trapping layer may be formed of a nitride, silicon rich nitride, and may include multiple layers of different nitrides according to some embodiments. Prior to forming the charge trapping dielectric 522 it is possible to remove the portion of dielectric 510*a* left uncovered by select gate 516 from the first region.

At step 810, the charge trapping dielectric 522 can be removed from the third region 508. According to various embodiments, the portion of the charge trapping dielectric 522 that is to be removed can be removed by masking and etching to cover the first and second regions 504 and 508 and to remove the charge trapping dielectric 522 and gate dielectric 510*c* from the third region 508.

At step 812, a second gate conductor layer 524 can be disposed in all three regions 504, 506, and 508 by, for instance, deposition. The second gate conductor layer 524 may be thinner than the first gate conductor layer 512.

At step 814, a hard mask may be employed to protect the third region 508. The hard mask may comprise any appropriate material or combination of materials such as amorphous carbon, SiN, SiON, SiO2, or some combination thereof. As an example, as shown in FIGS. 6A-6D, amorphous carbon as first hard mask layer 542 is deposited over the entire gate conductor layer 524, followed by deposition of SiON as second had mask layer 544. A masking step 546 is used to cover the third region, and the SiON 544 at the first and second regions 504 and 506 is removed. The SiON 544 at third region is used as a mask to protect the amorphous carbon 542 at third region and to etch the amorphous carbon 542 in first and second region. The masking layer 546 is also removed during the removal of mask 542 in the first and second regions. At this step, only the amorphous carbon 542 and SiON 544 at third region are remained At step 816, the second gate conductor layer 524 can then be removed (e.g., etched) to define a second logic gate 526 in the third region 508 by using masking layer 536. Additionally a memory gate 528 may be defined from the second gate conductor layer 524. Preferably, the memory gate 528 is formed on the sidewall of the select gate 516 and is separated from the select gate 516 by the charge trapping dielectric 522. Additionally, the memory gate 528 is separated from the substrate 502 by charge trapping dielectric 522. Together the select gate 516, charge trapping dielectric, and the memory gate 528 form a split-gate non-volatile memory cell 532. Additionally, because the memory gate 528 and the logic gate 526 were formed from the same layer of gate conductor 524, the height of gate 526 is substantially the same as the width of the memory gate 528 at its base. Similarly, because select gate 516 and first logic gate 518 were formed from the same layer of gate conductor 512, they have substantially the same height according to various embodiments.

Figure 9:
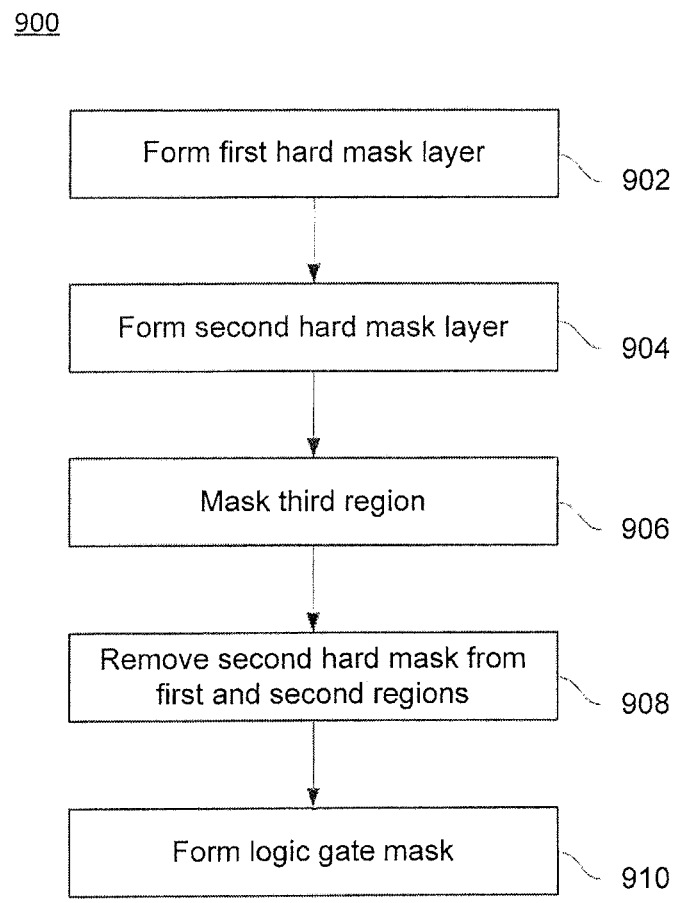
FIG. 9 is a flowchart depicting a method of manufacturing a semiconductor device according to embodiments.

FIG. 9 is a flowchart depicting a method 900 of manufacturing a semiconductor device 500 according to various embodiments. Method 900 will be described with reference to FIGS. 6A-6D. As shown in FIG. 9, a first hard mask layer 542 may be formed at step 902 on top of the gate conductor layer 524. A second hard mask layer 544 may be formed at step 904. At step 906, the third region 508 is masked with mask 546. As shown in FIG. 6A, mask 546 covers the entirety of the third region, but this need not be the case.

At step 908, the portion of the second hard mask 544 that was not itself masked by mask 546 has been removed by, e.g., etching. A subsequent etching step may also be employed to remove the portion of first hard mask 542 from first and second region by using the remaining hard mask 544 in the third region. The mask layer 546 is also removed either at the same step or prior to removal of 542 in first and second region. At this step, only the third region had mask 542 and 544 remain.

At step 910, the logic gate mask 536 is formed over the remaining hard mask layers 542 and 544 in the third region 508. The portions of the second gate conductor 524 that are disposed in the first region 504 and in the second region 506 remain unmasked and can be removed at later steps illustrated in, for instance, FIG. 5H.

Figure 10:
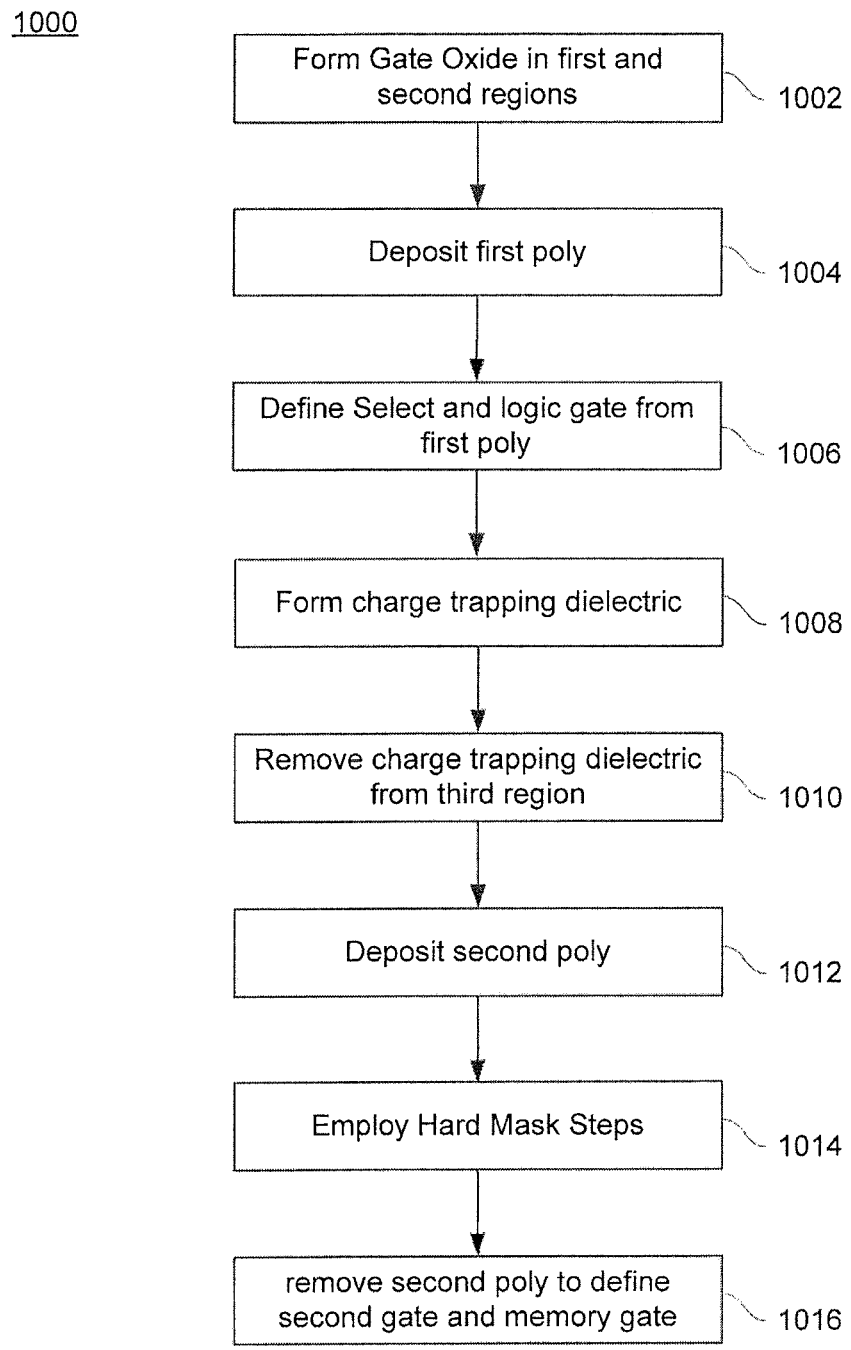
FIG. 10 is a flowchart depicting a method of manufacturing a semiconductor device according to embodiments.

FIG. 10 is a flowchart depicting a method 1000 of manufacturing a semiconductor device 500 according to various embodiments of the invention. Similarly to the description of methods 700 and 800, method 1000 will be described with simultaneous reference to FIGS. 5A-5J for ease of understanding. It should be understood, however, that method 1000 is not so limited to the embodiments depicted in FIGS. 5A-5J.

As shown in FIG. 10, gate dielectric is formed at step 1002. According to various embodiments, the gate dielectric 510b is formed on entire surface of semiconductor device 500. A masking and etch step is performed to remove gate dielectric 510b from the first region 504, and followed by gate dielectric growth 510a in first region 504. At this step, both the second region 506 and third region 508 have gate dielectric 510b, while first region 504 has gate dielectric 510a. For instance, a gate dielectric 510a could be formed in a first region 504 of the semiconductor device 500, a gate dielectric 510b could be formed in a second region 506 of the semiconductor device 500, and no gate dielectric formed in a third region 508 of the semiconductor device. However, according to some embodiments, gate dielectric could be formed in all of the first region 504, the second region 506, and the third region 508.

At step 1004, a first layer of gate conductor 512 is disposed on the semiconductor device 500. As noted above, the first layer of gate conductor 512 may be disposed using any appropriate method such as through deposition. According to some embodiments, the gate conductor layer 512 can be disposed conformally over the already-formed structures. For instance, the gate conductor layer 512 can be disposed conformally over gate dielectric 510a in the first region 504 and over 510b in the second region 506. If no gate dielectric has been formed in the third region 508, then the gate conductor layer 512 can be disposed directly on top of substrate 502 in the third region 508. However, if a gate dielectric 510c has been formed in the third region 508, then the gate conductor layer 512 is disposed over the gate dielectric 510c.

At step 1006, a select gate 516 and a logic gate 518 are defined from the first gate conductor layer 512. According to various embodiments, this can be accomplished by forming a mask 514a in the first region 504 over the first gate conductor layer 512 and forming a mask 514b over the first gate conductor layer 512. The masks 514a and 514b can be used to define the select gate and logic gate, respectively, as the first gate conductor layer 512 is masked.

At step 1008, a charge trapping dielectric 522 is formed on device 500. According to various embodiments, the charge trapping dielectric may be formed over all three regions 504, 506, and 508 of device 500. Additionally, the charge trapping dielectric may be formed of one or more dielectric layers. For instance, the charge trapping dielectric 522 may comprise a first dielectric layer 522a, a nitride layer 522b, and a second dielectric layer 522c. Regardless of the specific composition of the charge trapping dielectric 522, it preferably contains at least one charge trapping layer such as nitride layer 522b. The charge trapping layer may be formed of a nitride, silicon rich nitride, and may include multiple layers of different nitrides according to some embodiments. Prior to forming the charge trapping dielectric 522 it is possible to remove the portion of dielectric 510a left uncovered by select gate 516 from the first region.

At step 1010, the charge trapping dielectric 522 can be removed from the third region 508. According to various embodiments, the portion of the charge trapping dielectric 522 that is to be removed can be removed by masking and etching to cover the first and second regions 504 and 508 and to remove the charge trapping dielectric 522 and gate dielectric 510c from the third region 508.

At step 1012, a second gate conductor layer 524 can be disposed in all three regions 504, 506, and 508 by, for instance, deposition. The second gate conductor layer 524 may be thinner than the first gate conductor layer 512.

At step 1014, a hard mask stack may be employed to protect the third region 508. The hard mask may comprise any appropriate material or combination of materials such as amorphous carbon, SiN, SiON, SiO2, or some combination thereof. As an example, as shown in FIG. 6A-6D, SiN as first hard mask layer 542 is deposited over the entire second gate conductor layer 524, followed by deposition of second hard mask layer 544 SiO2. A masking step 546 is used to cover the third region and remove the SiO2 544 in the first and second region. After the removal of mask layer 546, hard mask 542 in the first and second regions 504 and 506 can be removed by using the remaining mask 544 in the third region to mask. At this step, only the hard mask stack 542 and 544 only remains in the third region.

The second gate conductor layer 524 can then be removed (e.g., etched) at step 1016 to define a second logic gate 526 in the third region 508. According to embodiments, the second logic gate 526 is defined by forming a logic gate mask 536 over the remaining hard mask layers 542 and 544 in the third region 508. Additionally a memory gate 528 may be defined from the second gate conductor layer 524. Preferably, the memory gate 526 is formed on the sidewall from of the select gate 516 and is separated from the select gate 516 by the charge trapping dielectric 522. Additionally, the memory gate 526 is separated from the substrate 503 by charge trapping dielectric 522. Together the select gate 516, charge trapping dielectric, and the memory gate 526 form a split-gate nonvolatile memory cell 532. Additionally, because the memory gate 528 and the logic gate 526 were formed from the same layer of gate conductor 524, the height of gate 526 is substantially the same as the width of the memory gate 528 at its base. Similarly, because select gate 516 and gate 518 were formed from the same layer of gate conductor 512, they have substantially the same height according to various embodiments.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of manufacturing a semiconductor device that includes a first region, a second region, and a third region, comprising:
   forming a select gate in the first region;
   forming a first logic gate in the second region;
   disposing a charge trapping dielectric in the first, second, and third regions;
   removing the charge trapping dielectric from the third region;
   disposing a gate conductor layer on the third region and over the charge trapping dielectric in the first and second regions; and
   etching the gate conductor layer to define a memory gate on a sidewall of the select gate and a second logic gate in the third region.

2. The method of claim 1, further comprising:
   forming a first logic gate dielectric in the first region;
   removing the first logic gate dielectric from the first region;
   forming a select gate dielectric in the first region; and
   removing the select gate dielectric that is uncovered by the select gate in the first region.

3. The method of claim 1, further comprising removing the first logic gate dielectric from the third region.

4. The method of claim 1, further comprising disposing a hard mask layer over the gate conductor layer.

5. The method of claim 4, wherein the mask layer comprises, amorphous carbon, silicon nitride, silicon oxynitride, silicon dioxide, or a combination thereof.

6. The method of claim 1, further comprising removing the gate conductor layer and the charge trapping dielectric from the second region.

7. The method of claim 1, wherein the select gate and the first logic gate are formed by etching the same layer of gate conductor.

8. The method of claim 1, further comprising forming a gate dielectric in the first region and forming a gate dielectric in the second region prior to forming one of the select gate and the first logic gate.

9. The method of claim 8, further comprising forming a gate dielectric in the third region after removing the charge trapping dielectric from the third region.

10. The method of claim 9, wherein at least two of the gate dielectric in the first region, the gate dielectric in the second region, and the gate dielectric in the third region have different thicknesses.

11. The method of claim 1, wherein the gate conductor layer is etched such that gate conductor is removed from a second sidewall of the select gate.

12. The method of claim 1, wherein the memory gate and the second logic gate have substantially the same thickness.

13. The method of claim 1, wherein the charge trapping dielectric comprises a nitride layer sandwiched between two layers of silicon dioxide.

14. The method of claim 1, wherein etching the gate conductor layer comprises:
   forming a first hard mask layer over the gate conductor layer;
   forming a second hard mask layer over the first hard mask layer;
   masking the first and second hard mask layers in the third region; and
   removing the first and second hard mask layers form the first and second regions.

* * * * *